(12) United States Patent
Savard et al.

(10) Patent No.: US 6,489,812 B1
(45) Date of Patent: Dec. 3, 2002

(54) TEMPERATURE-COMPENSATED SMALL SIGNAL PEAK DETECTOR

(75) Inventors: Christian S. Savard, Hull (CA); Dejan Banic, Ottawa (CA); Jack Dounetas, Aurora (CA)

(73) Assignee: Nortel Networks Limited, Montreal (CA)

(*) Notice: Subject to any disclaimer, the term of this patent is extended or adjusted under 35 U.S.C. 154(b) by 0 days.

(21) Appl. No.: 09/975,965

(22) Filed: Oct. 15, 2001

Related U.S. Application Data (60) Provisional application No. 60/308,574, filed on Jul. 31, 2001.

(51) Int. Cl.[7] ............................................. G01R 19/00
(52) U.S. Cl. .......................... 327/59; 327/83; 327/341; 327/513; 330/296
(58) Field of Search ................ 327/58–62, 65, 327/67, 72, 78, 83, 87, 89, 336, 339, 341, 344, 345, 361, 352, 362, 363, 512, 513; 330/256, 296, 259, 261, 292

(56) References Cited

U.S. PATENT DOCUMENTS

| | | | |
|---|---|---|---|
| 3,700,920 A | * 10/1972 | Eyler | 303/DIG. 5 |
| 5,585,748 A | * 12/1996 | Yamaguchi et al. | 327/101 |
| 6,064,238 A | 5/2000 | Wight et al. | 327/58 |
| 6,233,440 B1 | * 5/2001 | Taylor | 330/296 |

\* cited by examiner

Primary Examiner—Tuan T. Lam
Assistant Examiner—Minh Nguyen
(74) Attorney, Agent, or Firm—Ridout & Maybee LLP (57) ABSTRACT

A system and method for temperature-compensated small signal peak detection. A small amplitude signal peak detector includes an exponential operator for generating a modulated signal through the application of an exponential function to the input signal. The peak detector also includes an averaging circuit for obtaining the average value of the modulated signal and an inverting offset stage for inverting the signal and removing an offset component. The resulting signal is directly proportional to the peak value of the input signal. The peak detector further includes a temperature compensation circuit for canceling the temperature-dependent effects introduced by the exponential operator and averaging means. The temperature compensation circuit is a thermistor with temperature-dependent characteristics matched to the temperature-dependent characteristics of the circuit when operated without a temperature compensation circuit.

23 Claims, 6 Drawing Sheets

TEMPERATURE-COMPENSATED SMALL SIGNAL PEAK DETECTOR

This application claims the benefit of provisional application 60/308,574 filed Jul. 31, 2001.

FIELD OF THE INVENTION

The present invention relates generally to signal processing, and more particularly to a temperature-compensated peak detector for low amplitude approximately periodic signals.

BACKGROUND OF THE INVENTION

A common circuit found in signal processing applications is a peak detector. The function of a peak detector is to receive an AC input signal and output a DC signal that is proportional to the peak voltage of the AC input signal.

The basic peak detector employs a diode, a resistor and a capacitor to rectify the AC component of the input signal. The capacitor is charged to the peak of the input signal and slowly discharges during the negative slope of the AC input signal, with a time constant determined by the values of the capacitor and resistor. With a time constant much larger than the period of the AC input signal, the peak detector produces a relatively smooth DC output signal with a small ripple voltage.

The basic peak detector circuit is inapplicable to small voltage applications as the input signal must be sufficiently large to overcome the threshold (or forward bias) voltage of the diode.

Accordingly, it has been necessary to design peak detector circuits that are biased by an external source. The input signal is then added to the external bias (or offset) voltage and applied to the diode (or other semiconductor junction). Such a circuit then requires that the influence of the external bias voltage be removed or cancelled from the DC output so as to arrive at a signal proportional to the peak of the AC input signal.

An important parameter in determining a system's bit-error-rate performance is the system's extinction ratio. This parameter is the ratio between the signal power level during a logical binary "high" and the signal power during a logical binary "low". It is essentially a measurement of the extent to which a logical 1 is distinguishable from a logical 0. The extinction ratio is usually expressed in decibels.

For commercial applications, it is desirable that a circuit have an extinction ratio higher than 8.2 dB for all operating temperatures. For operating temperature design parameters of −10 C. to 70 C., it is desirable that the circuit have an extinction ratio of about 10 to 11 dB under normal conditions, with a variation of 1 to 2 dB due to temperature changes.

It has been found that the semiconductor components commonly used in peak detector designs exhibit a non-linear temperature variation that can cause unacceptably large variations in the extinction ratio. In order to address the temperature problem, a non-linear compensation solution is necessary. It is advantageous to solve the temperature compensation problem with a simple design to minimize the number of components necessary and to preserve board space and reduce the overall circuit cost.

BRIEF SUMMARY OF THE INVENTION

The present invention provides a system and method of obtaining a signal proportional to the peak value of an approximately periodic low amplitude input signal that compensates for non-linear temperature variations.

In one aspect, the present invention provides a peak detector that receives an approximately periodic input signal and produces an output signal proportional to the peak of the input signal, the peak detector includes an exponential operator for receiving the input signal and generating a modulated signal proportional to an exponential function of the input signal, an averaging circuit for receiving the modulated signal and generating an average signal proportional to the average amplitude of the modulated signal and a temperature compensator for adjusting the average signal to eliminate temperature-dependent characteristics from the average signal and thereby produce the output signal.

In another aspect, the present invention provides a method of obtaining an output signal proportional to the peak value of an approximately periodic input signal, comprising the steps of receiving the input signal at an input port, generating a modulated signal proportional to an exponential function of the input signal, generating an average signal proportional to the average value of the modulated signal, compensating for temperature-dependent characteristics contained in the average signal and producing the output signal at an output port.

Other aspects and features of the present invention will become apparent to those ordinarily skilled in the art upon review of the following description of specific embodiments of the invention in conjunction with the accompanying figures.

BRIEF DESCRIPTION OF THE FIGURES

Reference will now be made, by way of example, to the accompanying drawings which show a preferred embodiment of the present invention, and in which.

DETAILED DESCRIPTION OF AN EMBODIMENT

Figure 1:
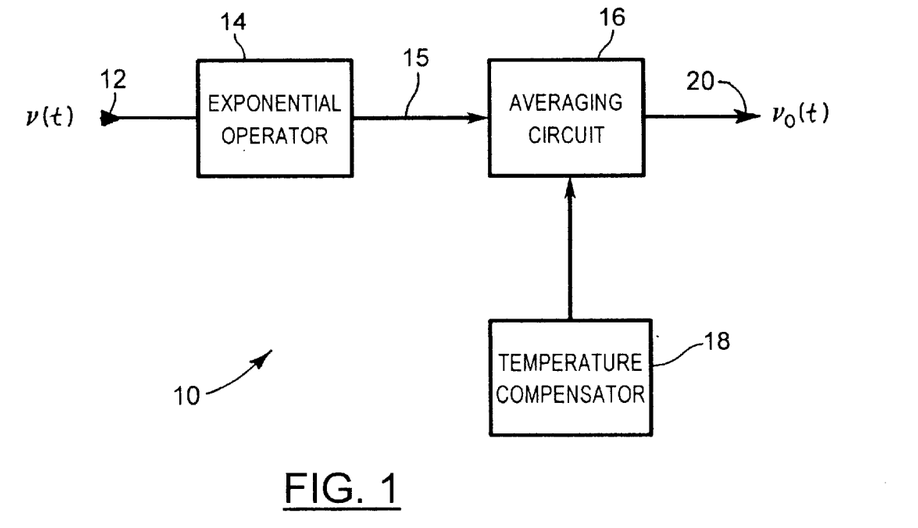
FIG. 1 shows, in block diagram form, a peak detector according to the present invention.

Reference is made to FIG. 1, which shows, in block diagram form, a peak detector 10 according to the present invention. As will be described in greater detail below, the peak detector 10 receives an input signal v(t) and generates an output signal $v_o(t)$.

The peak detector 10 comprises an input port 12, an exponential operator 14, an averaging circuit 16, a temperature compensator 18 and an output port 20. The input signal v(t) is applied at the input port 12. The input signal v(t) comprises an alternating signal. In one embodiment, the input signal v(t) is an approximately periodic small amplitude signal. Given its approximately periodic nature, the average value of the amplitude of v(t) is constant with respect to time.

The input port 12 is connected to the exponential operator 14. The exponential operator 14 modulates the input signal v(t) with an exponential function, such that the upper portion of the periodic signal is amplified to an exponentially greater degree than the lower portion of the signal. Moreover, within the upper portion of the input signal v(t), the higher amplitude portion will be amplified to an exponentially greater degree than the lower amplitude portion of the signal. In a graphical sense, the top portion of the input signal v(t) is 'stretched' upwards by the exponential operator. The exponential operator 14 produces an exponentially modulated signal 15.

The averaging circuit 16 determines the average amplitude of the exponentially modulated signal 15. Because the input signal v(t) has been exponentially modulated by the exponential operator 14, the average value of the exponentially modulated signal 15 is no longer constant. In the periodic input signal v(t) an upper and lower maximum amplitude corresponding to a peak in the signal have the same magnitude and offset each other in the determination of the average value of the input signal v(t). In the exponentially modulated signal 15 an upper maximum amplitude is exponentially larger in magnitude than a lower maximum amplitude, thereby causing a higher average value of the exponentially modulated signal 15. Accordingly, the average value of the exponentially modulated signal 15 will track peaks in the input signal v(t).

The averaging circuit 16 is coupled to a temperature compensator 18. The operating temperature of the peak detector 10 and its environment may experience wide variations. The change in operating temperature can result in problems with drift in the components or elements comprising the exponential operator 14 or the averaging circuit 16. Accordingly, the temperature compensator 18 causes the averaging circuit 16 to eliminate temperature-dependent characteristics from the average signal, leaving an output signal $v_o(t)$. The output signal $v_o(t)$ appears at the output port 20.

Figure 2:
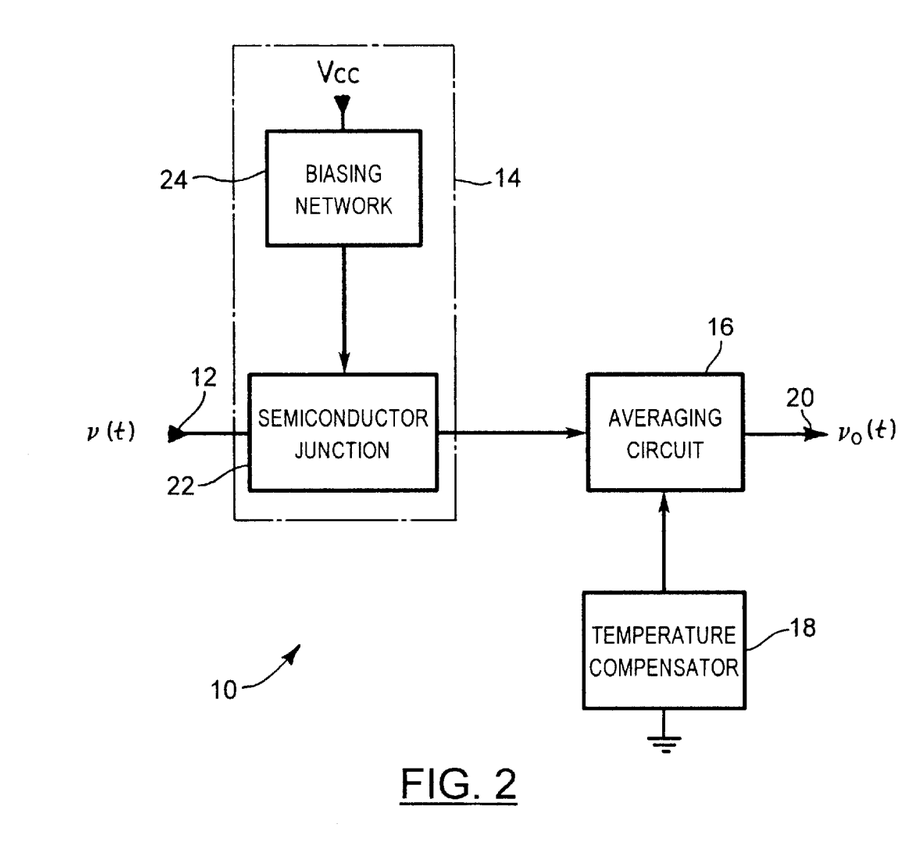
FIG. 2 shows, in block diagram form, a peak detector according to the present invention.

Reference is now made to FIG. 2, which shows in block diagram form a peak detector 10 according to the present invention. As in FIG. 1, the peak detector 10 comprises the input port 12, the output port 20, the exponential operator 14, the averaging circuit 16 and the temperature compensator 18. The exponential operator 14 comprises a semiconductor junction circuit 22 and a biasing network 24.

The exponential modulation of the input signal v(t) is implemented by the semiconductor junction circuit 22, which includes an semiconductor element with a current-voltage characteristic that includes an exponential region. The biasing network 24 sources a biasing current through the semiconductor junction circuit 22 so as to ensure the semiconductor element is forward biased and operating within the exponential region of its current-voltage characteristic. Without the biasing network 24, the input signal v(t) would need to provide sufficient voltage to forward bias the semiconductor element and cause it to conduct. Because a small amplitude input signal v(t) would not have sufficient voltage to overcome the threshold voltage for operating the semiconductor element and signal information would be lost. Accordingly, the biasing network 24 is necessary for the operation of the peak detector 10 with small amplitude signals.

Figure 3:
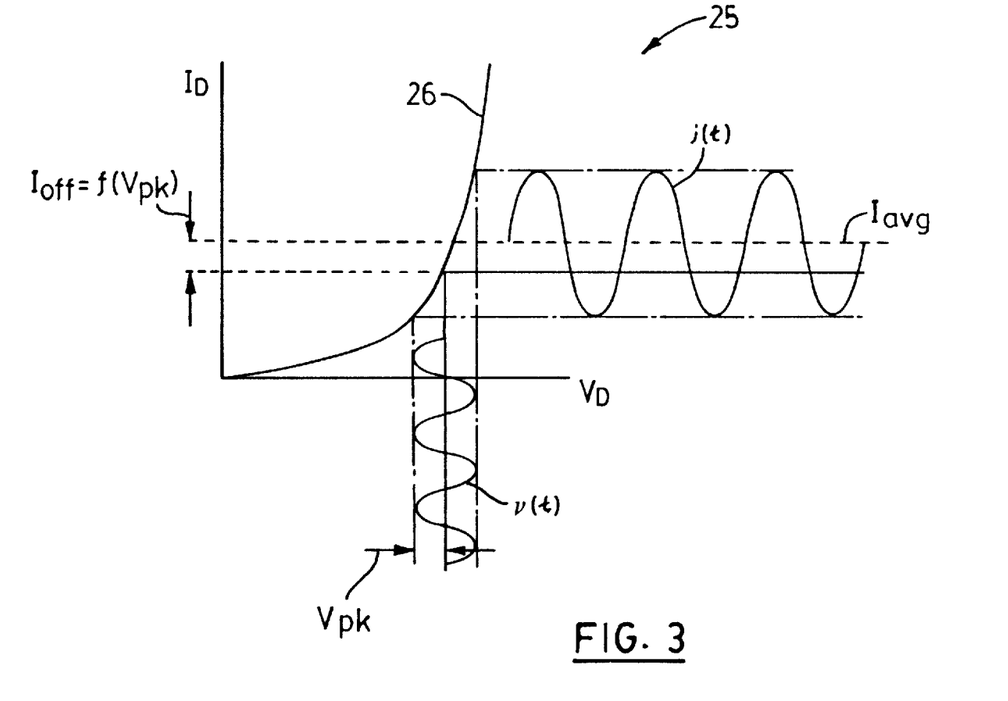
FIG. 3 shows a graph of the current-voltage characteristic for a diode, and the effect of a diode upon a sinusoidal voltage signal.

Reference is now made to FIG. 3, which shows a graph 25 of the current-voltage characteristic of a semiconductor junction, and more particularly, a diode. The graph 25 displays the forward-bias region of operation. The curve 26 depicts the exponential relationship between the current through the diode $I_D$ and the voltage across the diode terminals $V_D$.

The graph 25 also depicts the diode current i(t) produced by a sinusoidal input signal v(t). The sinusoidal input signal v(t) has a peak voltage $V_{pk}$ and an average voltage $V_{avg}$. The average voltage $V_{avg}$ is a constant value that does not vary with changes in $V_{pk}$. The diode current i(t) is an exponential function of the input signal v(t), the relationship being defined by the exponential curve 26. The average current $I_{avg}$ is offset from the current corresponding to the average voltage $V_{avg}$ of the input signal v(t) by an offset current $I_{off}$. The offset current $I_{off}$ is a function of the peak value $V_{pk}$ of the input signal v(t), meaning that the average current $I_{avg}$ will vary with changes in $V_{pk}$. Accordingly, the peak value of a signal can be detected using the average value of an exponential modulation of the signal.

In the forward bias region, the exponential current-voltage relationship for a diode is closely approximated by:

$$I_D = I_s\left(e^{\frac{V_D}{V_t}} - 1\right) \quad (1)$$

where $I_D$ is the current through the diode, $V_D$ is the voltage across the diode, $I_s$ is the reverse saturation current and $V_t$ is the threshold voltage of the semiconductor junction. As shown by Equation (1), the relationship between the diode voltage $V_D$ and the diode current $I_D$ is an exponential relationship.

An input signal v(t) may be represented by a sinusoidal source with a frequency of $\omega$ and an amplitude of $V_{pk}$, $$v(t) = V_{pk} \cos \omega t + V_{bias} \quad (2)$$

When such an input signal is applied to the semiconductor junction having the characteristics shown in Equation (1), the resulting signal is given by, $$I_D = I_s\left(e^{\frac{V_{pk}\cos(\omega t) + V_{bias}}{V_t}} - 1\right) \quad (3)$$

The expression for the average current through a forward biased diode that is modulated by a sinusoidal signal such as $V_{pk} \cos(\omega t)$ is then, $$\bar{I}_D = \frac{1}{2}I_s e^{\frac{V_D + V_{pk}}{V_t}} + \frac{1}{2}I_s e^{\frac{V_D - V_{pk}}{V_t}} - I_s \quad (4)$$

The non-linearity of the transfer curve means that the exponential of the first term of Equation (4) is much greater than the exponential of the second term, such that the second term may be ignored. The relationship can then be expressed in terms of either the average current or the average voltage, which are, respectively, $$\bar{I}_D = \frac{1}{2} I_s e^{\left(\frac{V_D + V_{pk}}{V_t}\right)} \qquad (5)$$

$$V_D = V_t \ln\left(\frac{2\bar{I}_D + I_s}{I_s} + 1\right) - V_{pk} \qquad (6)$$

From Equation (6) it can be seen that the average voltage across the diode $V_D$ varies with the peak voltage $V_{pk}$ of the input signal v(t).

Figure 4:
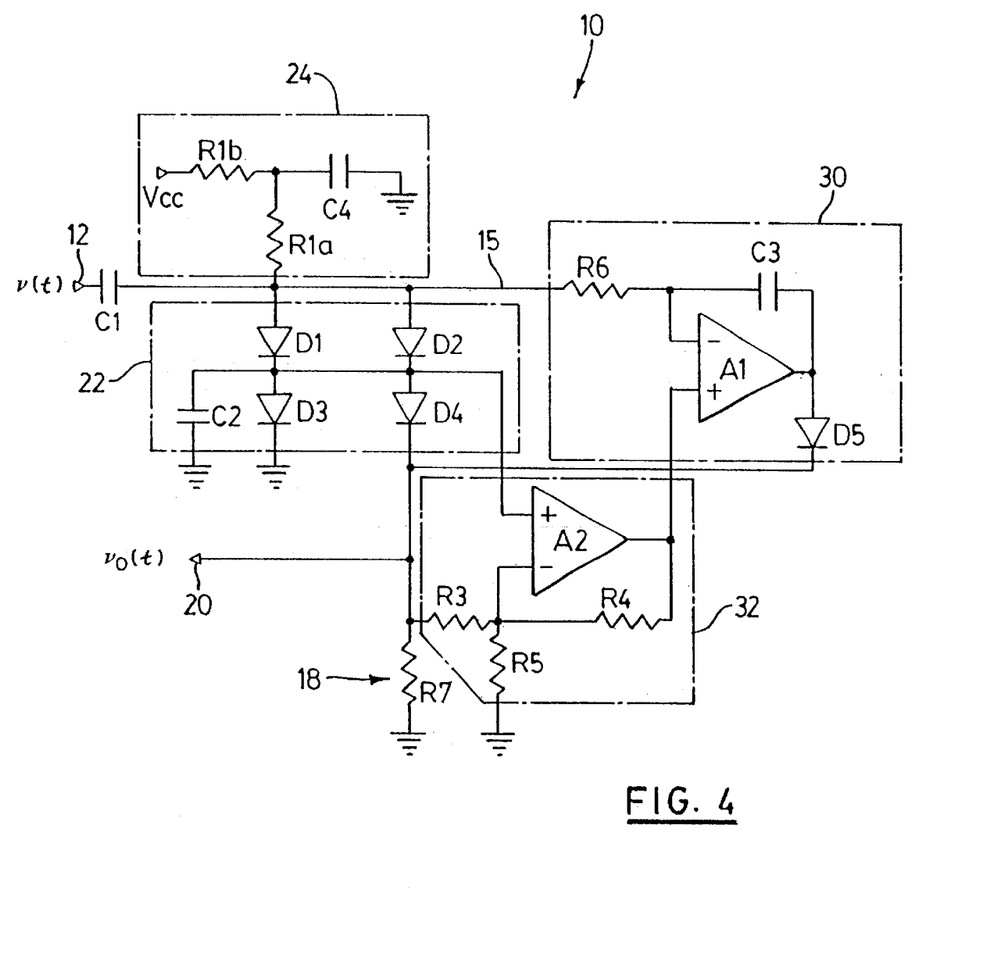
FIG. 4 shows an electrical schematic of a peak detector according to the present invention.

Reference is now made to FIG. 4, which depicts an electrical schematic of an implementation of the peak detector 10 of FIG. 2. The peak detector 10 includes the input port 12, the output port 20, the semiconductor junction circuit 22, the biasing network 24 and the temperature compensator 18. The averaging circuit 16 (FIG. 2) is implemented by an integrator 30 and further includes an inverter with offset 32. The peak detector 10 also includes a coupling capacitor C1 between the input port 12 and the semiconductor junction 22 to remove DC components of the input signal v(t).

As shown in FIG. 4, the semiconductor junction circuit 22 comprises four diodes D1, D2, D3 and D4 and a capacitor C2. The first diode D1 and second diode D2 are connected in parallel, with their anodes coupled to the input port 12 through coupling capacitor C1. The cathodes of the first and second diodes D1, D2 are coupled to ground through capacitor C2. The anodes of the third and fourth diodes D3, D4 are connected to the cathodes of the first and second diodes D1, D2. The cathode of the third diode D3 is connected to ground and the cathode of the fourth diode D4 is connected to the output port 20.

In order to operate with low amplitude signals, the diodes of the semiconductor junction circuit 22 need to be forward biased. Accordingly, the anodes of the first and second diodes D1, D2 are coupled to the positive DC voltage supply $V_{cc}$ through the biasing network 24. The biasing network 30 comprises two biasing resistors R1$a$, R1$b$ and a capacitor C4. The two biasing resistors R1$a$, R1$b$ are connected in series, with the first biasing resistor R1$a$ connected to the anodes of the first and second diodes D1, D2 and with the second biasing resistor R1$b$ connected to the positive DC voltage supply $V_{cc}$. The capacitor C4 is connected between ground and the node between the two biasing resistors R1$a$, R1$b$, so as to shunt any AC signals to ground.

The integrator 30 comprises an operational amplifier A1 configured as an integrator using a resistor RX and a capacitor C3. The resistor R6 couples the inverting input of the operational amplifier A1 to the anodes of the first and second diodes D1, D2 of the semiconductor junction circuit 22. The capacitor C3 is configured in a feedback loop, coupling the output of the operational amplifier A1 to the inverting input of the operational amplifier A1. A diode D5 couples the output of the operational amplifier A1 to the output port 20.

The peak detector 10 further includes the inverting offset stage 32. The inverting offset stage 32 includes an operational amplifier A2 and three resistors R3, R4, R5. Resistor R3 is connected between the output port 34 and the inverting input of the operational amplifier A2. Resistor R5 couples the inverting input of the operational amplifier A2 to ground. Resistor R4 is connected in a feedback loop between the output of the operational amplifier A2 and the inverting input of the operational amplifier A2. The output of the operational amplifier A2 is connected to the non-inverting input of the operational amplifier A1 of the integrator 30. The non-inverting input of the operational amplifier A2 is connected to the cathodes of the first and second diodes D1, D2.

The temperature compensator 18 comprises a thermistor R7 connected between the output port 20 and ground.

In operation, an input signal v(t) is applied at the input port 12. The coupling capacitor C1 removes any DC component from the input signal v(t), and passes through an approximately periodic small-amplitude AC signal.

The biasing network 24 supplies a DC current through the biasing resistors R1$b$, R1$a$ to the anode of the first and second diodes D1, D2. AC signals developed in the first biasing resistor R1$a$ are shunted to ground through the capacitor C4. The capacitor C4 does not pass DC signals, so the total DC current passes through the two biasing resistors R1$a$, R1$b$. Note that all the DC current must flow through the semiconductor junction circuit 22, because the DC current cannot pass through the coupling capacitor C1, the feedback capacitor C3 and the high impedance of the inverting input to the operational amplifier A1. Accordingly the same DC current will flow through the first diode D1 and the second diode D2, assuming they share identical properties. The diodes D1, D2 may be provided in a common device package to ensure their properties are as identical as possible. This DC current ensures the semiconductor junctions of the first and second diodes D1, D2 are forward-biased and operating in the exponential region of their current-voltage characteristics.

The AC input signal v(t) sourced through the coupling capacitor C1 modulates the DC biasing voltage established by the biasing network, such that the current through the first and second diodes D1, D2 has an AC and a DC component. Due to the capacitor C2 and the input impedance of the operational amplifier A2, the DC current in the first and second diodes D1, D2 must pass through the third and fourth diodes D3, D4. The AC signal at the centre of the four-diode network is shunted to ground through the capacitor C2.

Since all the DC (average) current through the first and second diodes D1, D2 must flow through the third and fourth diodes D3, D4, the currents are related insomuch as:

$$\bar{I}_{D1} + \bar{I}_{D2} = I_{D3} + I_{D4} \qquad (7)$$

where $I_{D3}$ and $I_{D4}$ are purely DC signals due to the capacitor C2, which shunts any AC signals to ground.

The average currents in the first and second diodes D1, D2 are identical and the voltage across the diodes D1, D2 is identical. Therefore, Equation (7) can be written as:

$$2\bar{I}_{D1} = I_{D3} + I_{D4} \qquad (8)$$

Substituting Equation (4) for the average current through the first diode D1 and applying Equation (1) to determine the currents through the third and fourth diodes D3, D4, the relation expressed in Equation (8) reveals that:

$$I_s e^{\frac{V_{D1}+V_{pk}}{V_t}} + I_s e^{\frac{V_{D1}-V_{pk}}{V_t}} - 2I_s = I_s e^{\frac{V_{D3}}{V_t}} + I_s e^{\frac{V_{D4}}{V_t}} - 2I_s \qquad (9)$$

In order to satisfy the relationship in Equation (9), we conclude that:

$$V_{D3} = \bar{V}_{D1} + V_{pk}$$

$$V_{D4} = \bar{V}_{D1} - V_{pk} \qquad (10)$$

Referring again to FIG. 4, the AC voltage appearing at the anodes of the first and second diodes D1, D2 corresponds to the exponentially modulated input signal 15. The exponentially modulated input signal 15 is coupled to the integrator 30 through the resistor R6. The integrator 30 also has an offset as a result of the connection of the non-inverting input of the operational amplifier A1 with the output of the inverting offset stage 32. The AC characteristic of the integrator 30 is that of a low pass filter so it is the average value of the voltage at the anodes of the first and second diodes D1, D2 that serves as an input into the integrator 30.

The time-domain equation for an inverting integrator with an offset is:

$$v_{o1}(t) = v_{o2}(t) + A_{int} \int_0^t [v_{o2}(\tau) - v_{in}(t)] d\tau \qquad (11)$$

where $v_{o1}(t)$ is the output of the operational amplifier A1, $v_{in}(t)$ is the input voltage from the anodes of the first and second diodes D1, D2, $v_{o2}(t)$ is the a, offset voltage at the non-inverting input of the operational amplifier A1, and $A_{int}$ is the gain of the integrator 30, as determined by $A_{int}=1/R6C3$.

The diode D5 limits the output of the integrator 30 to positive values. The voltage drop across the diode D5 may be ignored in analysis of the operation of the integrator 30 as any introduced offset voltage will decay to zero in steady-state.

The gain factor $A_{int}$ determines the rate at which the integrator 30 will reach steady state. A gain factor of 1 is chosen, such that R6=1/C3.

With the input $v_{in}(t)$ to the integrator 30 being the average value of the input voltage $v_{in}$, the expression for output of the integrator becomes:

$$v_{o1}(t) = v_{o2}(t) + \int_0^t [v_{o2} - \overline{v}_{in}] d\tau \qquad (12)$$

As is apparent from Equation (8), the integrator 30 reaches steady state when the average input voltage $V_{in}$ equals the offset voltage $v_{o2}$.

Referring again to FIG. 4, the DC signal at the centre of the four-diode network of the semiconductor junction circuit 22, serves as the non-inverted input to the inverter with offset 32. The function of the inverter with offset 32 is to compensate for the DC signal introduced by the biasing network 24 and to adjust the proportionality of the output signal $v_o(t)$ to a desired relationship with the peak value of the input signal $V_{pk}$.

The general characteristic equation for the output of the inverter with offset 32 is given by:

$$v_{o2} = -Av_o + (A+B)V_{D3}, \quad \text{where} \qquad (13)$$

$$A = \frac{R_4}{R_3} \quad \text{and} \quad B = 1 + \frac{R_4}{R_5}$$

As was stated above, the output $v_{o2}$(offset voltage) of the operational amplifier A2 reaches steady state when it equals the average input voltage $V_{in}$. The average input voltage can be expressed in terms of the diode voltage $V_{D3}$ of the third diode D3 by the relationship:

$$V_{in} = V_{D3} + \overline{V}_{D1} \qquad (14)$$

Furthermore, as was expressed in Equation (10), the diode voltage $V_{D3}$ of the third diode D3 is the sum of the average input voltage $V_{in}$ and the peak voltage of the input signal $V_{pk}$. Substituting these relationships into Equation (13) to express the output voltage $V_o$ in terms of the peak voltage $V_{pk}$ and the average first diode voltage $V_{D1}$, results in:

$$v_o = \left(\frac{A+B-2}{A}\right) V_{D1} + \left(\frac{A+B-1}{A}\right) V_{pk} \qquad (15)$$

To eliminate the influence of the first term of Equation (15) upon the output voltage $v_o$ thereby causing the output voltage $v_o$ to be proportional solely to the peak voltage $V_{pk}$, the coefficients are selected such that the first term coefficient is zero and the second term coefficient is 2. Solving for A and B results in the determination that A=½ and B=3⁄2, which in turn leads to the following relationships between resistor values:

$$R1=2(R2) \text{ and } R5=2(R4) \qquad (16)$$

Based upon the above relationship between resistor values, Equation (13) for the offset voltage $v_{o2}$ may now be expressed as:

$$v_{o2} = -\frac{1}{2} v_o + 2V_{D3} \qquad (17)$$

The output voltage $v_o(t)$ is therefore established as a DC signal corresponding to twice the peak value $V_{pk}$ of the input signal v(t). The output voltage $v_o(t)$ may be taken across an output resistor connected between the output port 20 and ground.

It has been determined that the diodes D1, D2, D3 and D4 of the peak detector 10 result in temperature-dependent variations in the performance of the peak detector 10 that negatively impact the extinction ratio over the operating temperature range. Accordingly, an temperature compensator 18 is required at the output to minimize the temperature-dependent variations in the output signal $v_o(t)$. Using the thermistor R7 in place of a fixed resistor at the output port 20 provides such temperature compensation.

The selection of the thermistor R7 as the appropriate temperature compensator is based upon the operation of the peak detector 10 with a fixed resistor in place of the thermistor R7. With a fixed resistor in place, the peak detector 10 is operated with a range of input signals v(t) and over a range of operating temperatures. Mapping the output signal $v_o(t)$ under these various operating conditions results in a set of curves that depict the temperature-dependent characteristics of the peak detector 10. A thermistor is then selected such that its characteristic variation matches, as closely as possible, the temperature-dependent variations in the peak detector 10. Temperature-dependent changes in the output signal $v_o(t)$ are thereby cancelled or reduced, improving the extinction ratio of the peak detector 10 and, thus, its bit error rate.

Figure 5:
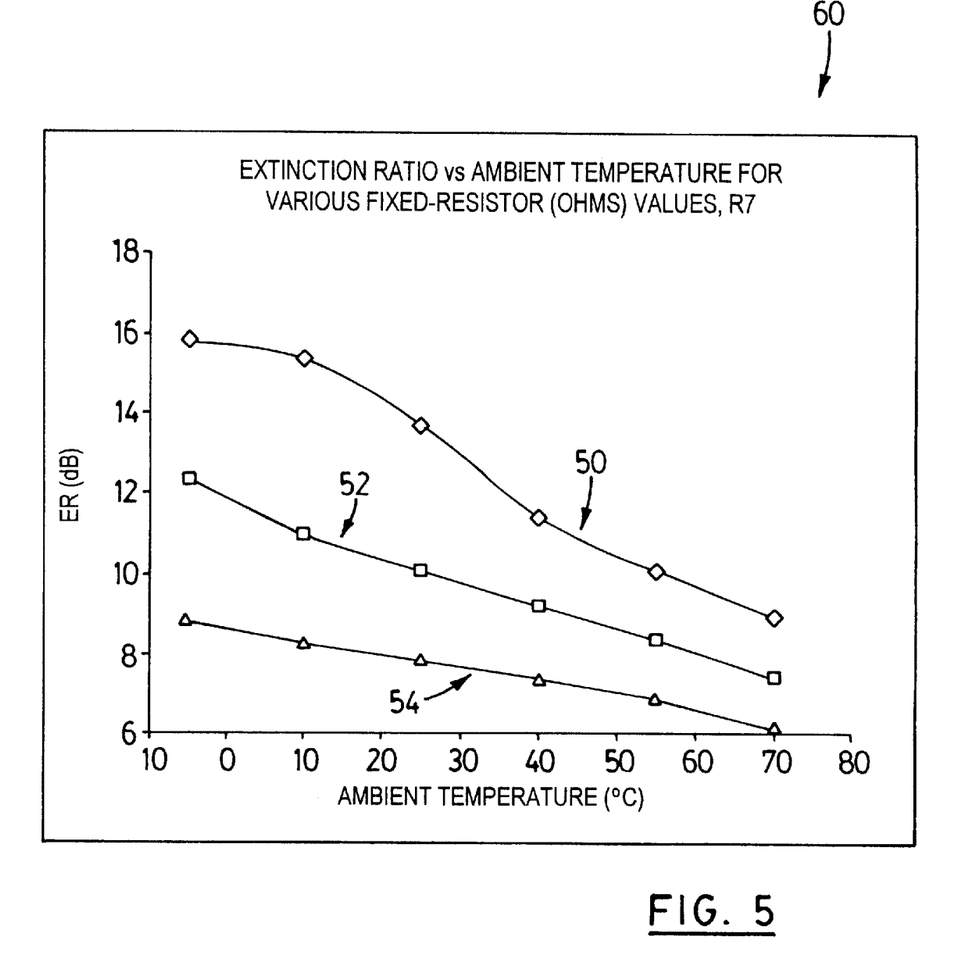
FIG. 5 shows a graph of the extinction ratio of a peak detector according to the present invention versus temperature, when operated with a fixed resistor in place of a thermistor.

Reference is now made to FIG. 5, which shows a graph 60 of the extinction ratio for the peak detector 10 for three values of a fixed resistor in place of thermistor R7 over a range of operating ambient temperatures. Measurements are made and extinction ratios are calculated at −5° C., 10° C., 25° C., 40° C., 55° C. and 70° C. The component values of the three resistors R7 are 30 Ohms, 50 Ohms and 500 Ohms. The 30 Ohm resistor results in the higher extinction ratio curve 50; the 50 Ohm resistor results in the middle extinction ratio curve 52; and the 500 Ohms resistor results in the lower extinction ratio curve 54. As shown by the curves 50, 52, 54, as the ambient temperature rises, the extinction ratio deteriorates. The relationship between temperature and extinction ratio is non-linear, meaning a non-linear solution is necessary to compensate for temperature-dependent variations in the peak detector 10.

A thermistor with a negative coefficient (NTC) has a resistance that decreases in response to increasing temperature in a non-linear relationship. Accordingly, the thermistor R7 may compensate for temperature-dependent variations in the extinction ratio.

Figure 7:
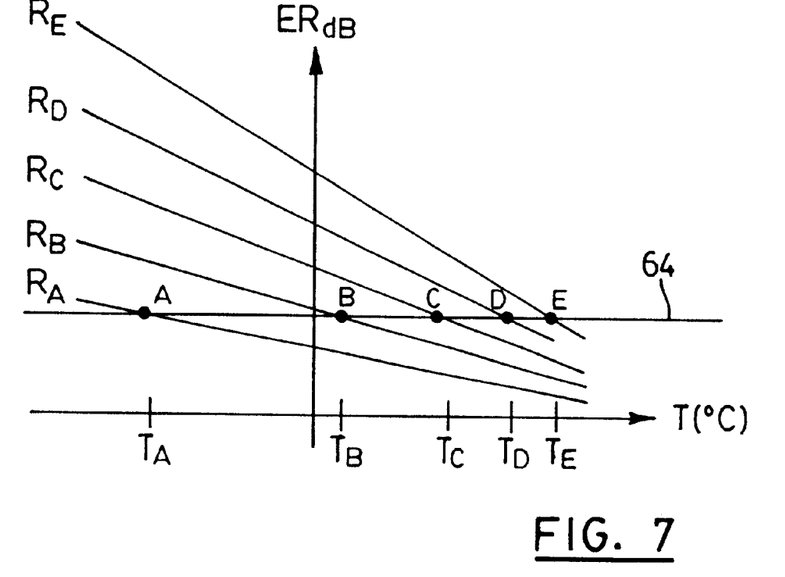
FIG. 7 shows a graph of the extinction ratio of a peak detector versus temperature employing a range of resistor values.

To determine an appropriate thermistor R7, a family of curves representing the extinction ration versus temperature relationship for a range of fixed resistor values is plotted. Reference is made to FIG. 7, which shows a graph of extinction ratio versus temperature for resistors $R_A$, $R_B$, $R_C$, $R_D$ and $R_E$. The graph results in five curves. By selecting a desired constant extinction ratio line 64, one obtains intersection points A, B, C, D and E indicating the resistor value necessary at respective temperatures $T_A$, $T_B$, $T_C$, $T_D$ and $T_E$ to achieve the desired extinction ratio.

Figure 8:
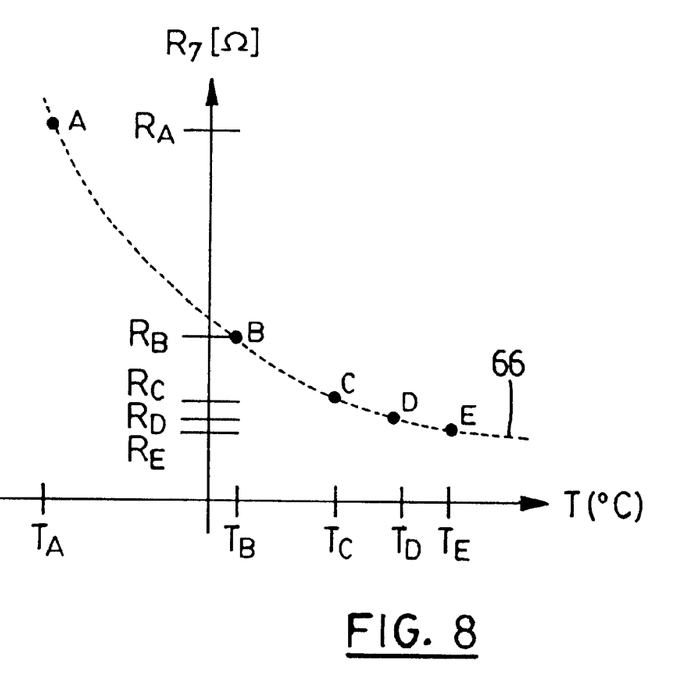
FIG. 8 shows a graph of the resistor values versus temperature, derived from FIG. 7.

Reference is next made to FIG. 8, which shows a graph of the intersection points A, B, C, D and E as a function of resistance and temperature. The graph results in a curve 66 of a relationship between resistance and temperature. This relationship is the desired characteristic of the thermistor R7. Accordingly, a thermistor R7 is selected to match, as closely as possible, the curve 66.

Figure 6:
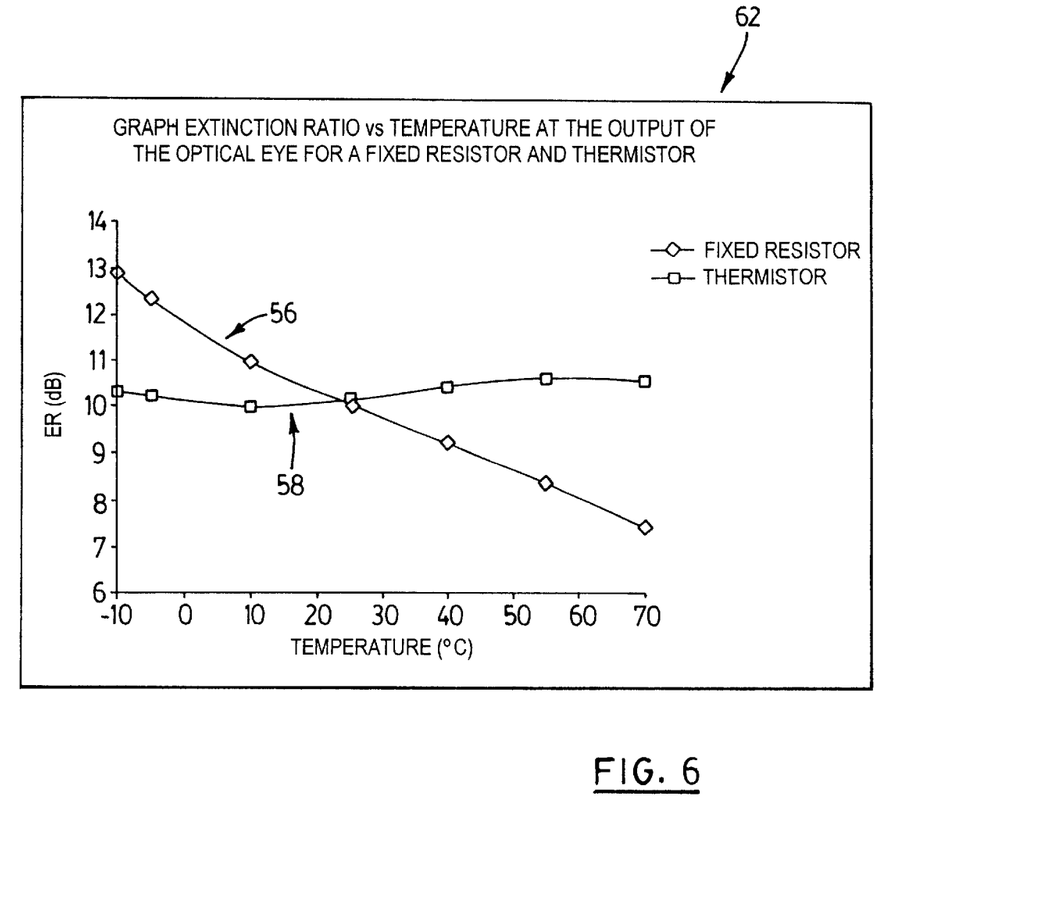
FIG. 6 shows a graph of the extinction ratio of a peak detector according to the present invention versus temperature.

Reference is now made to FIG. 6, which shows a graph 62 of the extinction ratio for the peak detector 10 over a range of temperatures. The graph 62 includes a sloped curve 56 depicting the relationship between temperature and extinction ratio when a fixed resistor is used in place of thermistor R7. The sloped curve 56 demonstrates that the extinction ratio deteriorates at higher operating temperatures to unacceptably low levels. The graph 62 further includes a substantially flat curve 58 depicting the relationship between temperature and extinction ratio when the peak detector 10 is operated with the thermistor R7 in place. The substantially flat curve 58 demonstrates that the non-linear characteristics of the thermistor R7 compensate for non-linear temperature variations in the peak detector 10 to result in a substantially constant extinction ratio at an acceptably high level.

Although the embodiment of the invention described above and in FIG. 4 employs discrete analog circuitry, the invention may also be implemented with integrated circuits.

The present invention may be embodied in other specific forms without departing from the spirit or essential characteristics thereof. Certain adaptations and modifications of the invention will be obvious to those skilled in the art. Therefore, the above discussed embodiments are considered to be illustrative and not restrictive, the scope of the invention being indicated by the appended claims rather than the foregoing description, and all changes which come within the meaning and range of equivalency of the claims are therefore intended to be embraced therein.

What is claimed is:

1. A peak detector that receives an alternating input signal and produces an output signal, the output signal being proportional to the peak of the input signal, the peak detector comprising:
    (a) an exponential operator adapted to receive the input signal and operable to generate a modulated signal proportional to an exponential function of the input signal;
    (b) an averaging circuit adapted to receive the modulated signal and operable to generate an average signal proportional to the average amplitude of the modulated signal; and
    (c) a temperature compensator operable to adjust the average signal to eliminate temperature-dependent characteristics from the average signal and thereby produce the output signal, wherein said temperature compensator includes a thermistor.

2. The peak detector as claimed in claim 1, wherein said exponential operator comprises a semiconductor junction.

3. The peak detector as claimed in claim 2, further comprising a biasing network coupled to said semiconductor junction and operable to sink a current through said semiconductor junction such that said semiconductor junction operates within the exponential region of its transfer characteristic.

4. The peak detector as claimed in claim 3, wherein said semiconductor junction comprises a diode.

5. The peak detector as claimed in claim 3, wherein said semiconductor junction comprises a network of four diodes and wherein a first two of said four diodes are connected in parallel with the anodes of said first two diodes being coupled to said input signal, and the anode of a third of said four diodes being connected to the cathodes of said first two diodes, the cathode of said third diode being connected to ground, and the anode of a fourth of said four diodes being connected to the cathodes of said first two diodes, the cathode of said fourth diode being coupled to said temperature compensator.

6. The peak detector as claimed in claim 4, wherein said averaging circuit comprises an integrator.

7. The peak detector as claimed in claim 6, further comprising an inverting offset stage coupled to said integrator and operable to produce an offset signal proportional to an unwanted offset component in said modulated signal, wherein said integrator comprises an operational amplifier configured as an integrator and receiving said offset signal and said modulated signal.

8. The peak detector as claimed in claim 7, wherein said inverting offset stage comprises an operational amplifier.

9. The peak detector as claimed in claim 8, wherein the output signal is approximately twice the peak value of the input signal.

10. The peak detector as claimed in claim 1, wherein said averaging circuit comprises an integrator.

11. The peak detector as claimed in claim 10, wherein said integrator comprises an operational amplifier.

12. The peak detector as claimed in claim 1, wherein said modulated signal produced by said exponential operator contains an unwanted offset component and said peak detector further comprising an inverting offset stage coupled to said averaging circuit and operable to remove said unwanted offset component from said average signal.

13. The peak detector as claimed in claim 12, wherein said inverting offset stage comprises an operational amplifier.

14. The peak detector as claimed in claim 1, wherein said thermistor has temperature-dependent characteristics matched to the temperature-dependent characteristics of the peak detector absent said thermistor.

15. A method of obtaining, from a peak detector, an output signal proportional to the peak value of an alternating input signal, comprising the steps of:
    (a) receiving the input signal at an input port;
    (b) generating a modulated signal proportional to an exponential function of the input signal;
    (c) generating an average signal proportional to the average value of said modulated signal;
    (d) compensating for temperature-dependent characteristics contained in said average signal to produce the output signal; and
    (e) outputting the output signal at an output port,
    wherein said step of compensating includes coupling a thermistor between said output port and ground.

16. The method as claimed in claim 15, wherein said step of compensating comprises determining said temperature-dependent characteristics through repeating steps (a) through (c) under varying temperature conditions and tracking variations in the output signal caused by said varying temperature conditions, and providing a temperature compensator having characteristics complementary to said temperature-dependent characteristics.

17. The method as claimed in claim 16, wherein said temperature compensator is a thermistor.

18. The method as claimed in claim 15, wherein said step of generating a modulated signal comprises sinking a bias current through a semiconductor junction such that said semiconductor junction remains biased in the exponential region of its current-voltage characteristic and coupling said input port to the anode of said semi-conductor junction.

19. The method as claimed in claim 18, wherein said semiconductor junction comprises a diode.

20. The method as claimed in claim 19, wherein said thermistor has temperature characteristics approximately matched to said temperature-dependent characteristics of the peak detector when operated without said step of compensating.

21. A method of selecting a themistor for providing temperature compensation in a peak detection circuit having temperature-dependent characteristics, the method comprising the steps of:

(a) operating the peak detection circuit with a fixed resistor in place of the thermistor and measuring the extinction ratio at the output of the peak detector over a range of operating temperatures;

(b) varying the component value of the fixed resistor and repeating step (a);

(c) graphing the measured extinction ratio versus temperature for more than one fixed resistor to display a set of curves; and (d) selecting the thermistor that has a resistance that varies with respect to temperature such that the non-linearity observed in the curves is minimized.

22. A method of obtaining from a peak detector an output signal proportional to the peak value of an alternating input signal, comprising the steps of, receiving the input signal at an input port;

generating a modulated signal proportional to an exponential function of the input signal;

generating an average signal proportional to the average value of said modulated signal;

adjusting said average signal to remove temperature-dependent characteristics; and outputting the output signal at an output port;

characterized in that:

said step of adjusting said average signal comprises providing a temperature compensator having temperature-dependent characteristics matched to the temperature-dependent components of said average signal created by said step of generating a modulated signal and said step of generating an average signal, wherein said temperature compensator includes a thermistor.

23. A peak detector that receives an alternating input signal and produces an output signal, the output signal being proportional to the peak of the input signal, the peak detector comprising:

(a) exponential operator means for receiving the input signal and generating a modulated signal proportional to an exponential function of the input signal;

(b) averaging means for receiving the modulated signal and generating an average signal proportional to the average amplitude of the modulated signal; and (c) temperature compensation means coupled to said averaging means and having temperature-dependent characteristics matched to the temperature-dependent characteristics of said exponential operator and said averaging means for cancelling the temperature-dependent characteristics within said average signal, thereby generating the output signal.

\* \* \* \* \*